(12) United States Patent
Lane et al.

(10) Patent No.: US 10,908,017 B2
(45) Date of Patent: Feb. 2, 2021

(54) MULTIPLE LIGHT SOURCE OUTPUT SMOOTHING

(71) Applicant: Microsoft Technology Licensing, LLC, Redmond, WA (US)

(72) Inventors: David M. Lane, Sammamish, WA (US); Andrew W. Hill, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 208 days.

(21) Appl. No.: 15/722,324

(22) Filed: Oct. 2, 2017

(65) Prior Publication Data
US 2019/0101440 A1 Apr. 4, 2019

(51) Int. Cl.
*G01J 1/24* (2006.01)
*F21V 23/00* (2015.01)
*F21K 9/64* (2016.01)
*F21V 9/00* (2018.01)
*G02F 1/13357* (2006.01)

(52) U.S. Cl.
CPC .............. *G01J 1/24* (2013.01); *F21K 9/64* (2016.08); *F21V 9/00* (2013.01); *F21V 23/005* (2013.01); *G02F 1/133602* (2013.01); *G02F 1/133603* (2013.01); *G02F 1/133611* (2013.01); *H05K 2201/10106* (2013.01); *H05K 2201/10113* (2013.01)

(58) Field of Classification Search
CPC ......... G01J 1/22; G01J 1/24; G02F 1/133603; G02F 1/133611; F21V 9/00

USPC .................................................. 250/216, 226
See application file for complete search history.

(56) References Cited

U.S. PATENT DOCUMENTS

| 7,597,469 B2 * | 10/2009 | Nishigaki ............ G02B 6/0026 362/613 |
| 8,177,408 B1 * | 5/2012 | Coleman ................ G02B 3/005 362/615 |

FOREIGN PATENT DOCUMENTS

EP 2562590 A1 2/2013

OTHER PUBLICATIONS

"International Search Report & Written Opinion Issued in PCT Application No. PCT/US18/052766", dated Jan. 9, 2019, 10 Pages.

* cited by examiner

*Primary Examiner* — Kevin K Pyo
(74) *Attorney, Agent, or Firm* — Holzer Patel Drennan (57) ABSTRACT

In accordance with one implementation, a method for multiple source light output smoothing includes measuring a light distribution generated by multiple light sources arranged within an electronic device and determining at least one brightness adjustment based on the measured light distribution that is sufficient to locally reduce light output within a discrete region of a surface of the electronic device to satisfy predefined luminosity criteria. The method further includes applying an optical filter between the multiple light sources and the surface, the optical filter configured to reduce light output within the discrete region according to the determined at least one brightness adjustment.

18 Claims, 5 Drawing Sheets

MULTIPLE LIGHT SOURCE OUTPUT SMOOTHING

BACKGROUND

Monitors, keyboards, and a variety of other types electronic devices utilize backlighting panels as sources for surface illumination. Modern backlighting panels include arrays of light emitters, such as LEDs, that may have individual characteristics causing large variances in brightness from one light emitter to another. In an effort to ensure relatively uniform brightness, back panel light distributions are typically measured in a factory setting and drive electronics are tailored, for each individual device, to regulate current supplied to individual light emitters to ensure that dimmer light emitters receive more current and brighter light emitters receive less current. In addition to brightness variations attributable to light-emitter components (e.g., LEDs), these current adjustments implemented by drive electronics may also be configured to account for brightness variations due to other device components. For example, light emitted from keyboard back panels may be non-uniformly blocked by paint, fabric, or laser-etched materials. The use of electronic circuitry to level hot spots and light output variation is expensive and increasingly complex as back panel technology advances to include increased numbers of LEDs of decreased size.

SUMMARY

A method disclosed herein provides for measuring a light distribution generated by multiple light sources arranged within an electronic device and determining at least one brightness adjustment based on the measured light distribution that is sufficient to locally reduce light output within a discrete region of a surface of the electronic device to satisfy predefined luminosity criteria. The method further provides for applying an optical filter between the multiple light sources and the surface, the optical filter configured to reduce light output within the discrete region according to the at least one brightness adjustment.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

DETAILED DESCRIPTION

Figure 1:
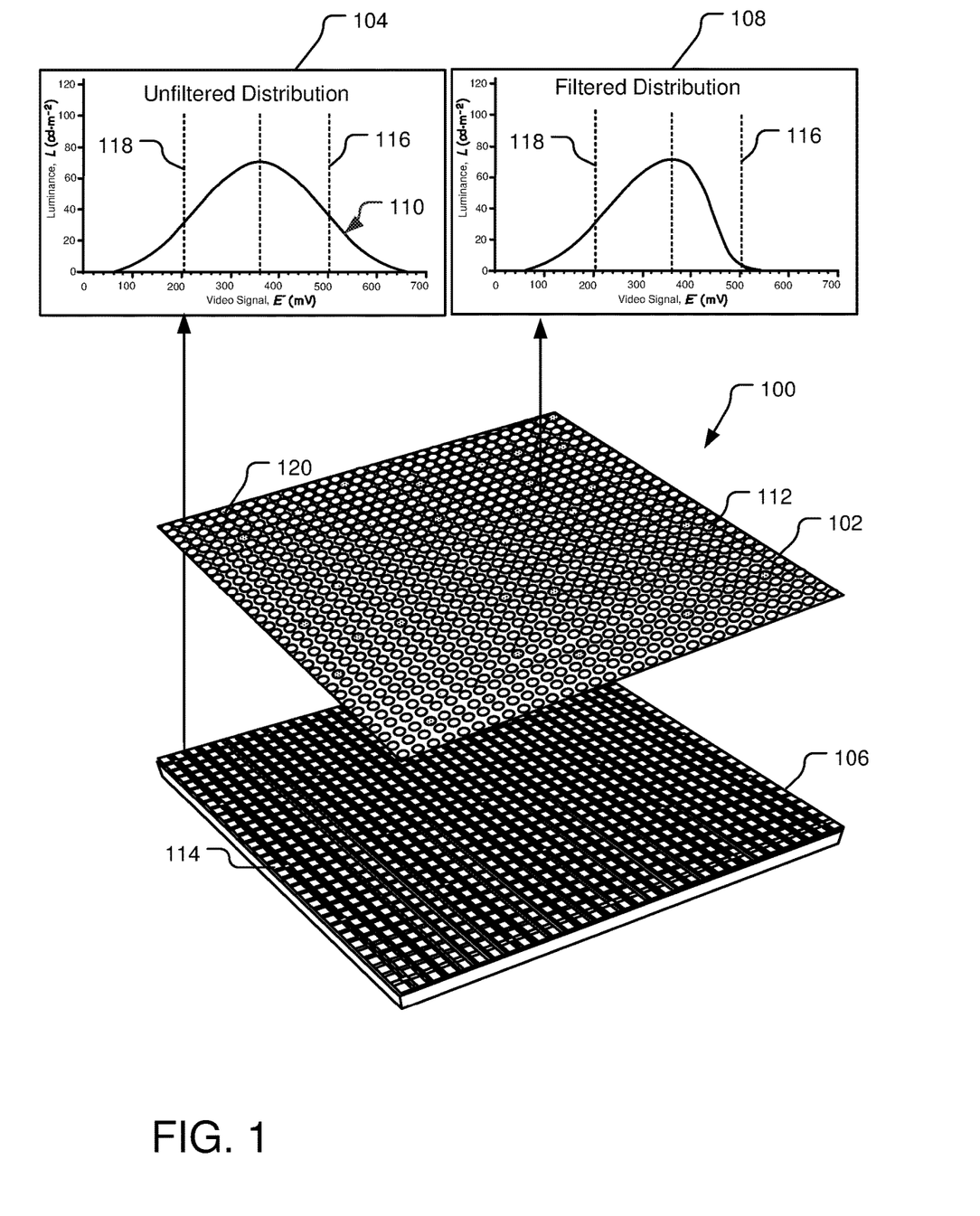
FIG. 1 illustrates an example electronic device including an optical filter for smoothing irregularities present in a light distribution generated by a multi-point light source.

FIG. 1 illustrates an example electronic device 100 including an optical filter 102 for smoothing irregularities present in an unfiltered light source distribution 104 generated by a multi-point light source 106. The multi-point light source 106 includes an array of light emitters which may assume different forms and characteristics in different implementations. In one implementation, the multi-point light source 106 is an array of light-emitting diodes (LEDs), such as a panel designed to provide backlighting for a light-emitting display (e.g., monitor, television) or other back-lit surface, such as a keyboard with backlighting circuitry.

Although LED arrays are the primary example referenced in the following figures, the multi-point light source 106 may, in other implementations, include other types of light emitters arranged different than the array shown in FIG. 1. For example, the multi-point light source array 106 may include one or more fluorescent tubes, electro-luminescent devices, gases discharge lamps, plasma panels, or any combination thereof. The various light emitters included in the multi-point light source 106 may assume a variety of sizes including without limitation, less than 1 mm (e.g., the size of a grain of sand or smaller), 3 mm, 5 mm, 10 mm, etc.

The unfiltered light source distribution 104 is an example distribution of the light emitted by the multi-point light source 106. If the individual light emitters of the multi-point light source 106 are LEDs selected at random for inclusion in the array (e.g., without brightness testing), wide irregularities in brightness may be observed in the unfiltered light distribution 104. For example, several bright spots may exist as the result of tolerances found in the components that make up the multi-point source array 106, resulting in a wide leading tail 110 in the unfiltered light distribution 104. During LED panel manufacturing processes, LEDs may be initially tested for compliance with predefined luminosity criteria. In some cases, LEDs that do not satisfy the criteria (e.g., for being too dim or bright) are discarded; in other cases, complex and costly drive mechanisms are employed to selectively supply variable current to the different LEDs according to a per-LED precision tuning. For example, the drive mechanisms are configured to supply dim LEDs receive with more current and bright LEDs with less current to smooth a resulting light distribution.

The optical filter 102 provides an alternate, less complex, and less expensive solution for smoothing irregularities in a light distribution. Light emitted by the multi-point light source 106 is directed through filter cells (e.g., a cell 112) of the optical filter 102, and the individual filter cells are individually-tuned to include different filtering characteristics determined based on characteristics of each specific device that is to incorporate the optical filter 102. The terms "cells" and "filter cells" are used broadly herein to refer to discrete regions of a light-transmissive surface that may either be unshaded (e.g., permitting 100% light throughput) or shaded to reduce light throughput by a predetermined amount. Other terms of art that may alternatively be used to describe these "cells" or "filter cells" include without limitation shade, optical shim, optical target, and shade area.

According to one implementation, each of the filter cells in the optical filter 102 is individually-tuned to reduce light throughput by a predetermined degree that is based on a measured luminance of one or more of the underlying light emitters (e.g., LED 114) of the multi-point light source 106.

In one implementation, the optical filter 102 is designed and positioned such that each individual filter cell aligns, along a primary direction of light travel, with a corresponding light emitter of the multi-point light source 106. For example, each filter cell is tuned to provide a degree of filtering for a corresponding light emitter to ensure that each light emitter of the multi-point light source 106 has a post-filtering luminance that is within a predetermined range of luminance values. As a result of this individual cell "tuning" for filtering of a corresponding region of the multi-point light source 106, the unfiltered light source distribution 104 is adjusted, yielding a filtered light source distribution 108 in which local hot spots and irregularities are effectively eliminated.

In FIG. 1, the optical filter 102 is shown as a thin film sheet including a number of printed cells with different optical characteristics to provide different degrees of filtering. Each individual cell is specifically designed to provide a calculated adjustment sufficient to reduce light throughput of a corresponding, measured light emitter to below a predetermined upper threshold (e.g., an upper luminosity threshold 116) without causing luminance of any of the initially "bright" light emitters to drop below a predetermined lower threshold (e.g., a lower luminosity threshold 118). Especially bright light emitters of the multi-point light source 106 are aligned with filter cells that offer a higher degree of throughput reduction, while less bright light emitters of the multi-point light source 106 are aligned with filter cells that offer a lesser degree of throughout reduction. Notably, some of the filter cells, such as filter cell 120, may be designed to permit transmission of all or substantially all incident light from the corresponding light emitter(s) of the multi-point light source 106.

The individually-tuned cells of the optical filter 102 may take on a variety of forms in different implementations. In one implementation, the individual cells are ink-jet printed on a plastic sheet, such as a sheet of mylar, polyester or other suitable material. The plastic sheet is included between the light emitter and a light-emitting outer surface of the electronic device. In another implementation, the optical filter 102 includes multiple stacked thin film sheets that each include printed cells. For example, cells with different filtering properties can be creating by stacking thin film layers with different printed characteristics (e.g., stacking three cells of a same 'tint' creates a stronger filter than a single cell of the tint stacked under one or more clear thin film sheets).

In yet another implementation, the optical filter 102 includes or more separate adhesive components, similar to "stickers" that can be robotically positioned on the multi-point light source 106 or other transparent component in a light path of the multi-point light source 106 to filter light of a corresponding one or more light emitters. In still another implementation, the cells of the optical filter 102 are printed directly on the electronic device 100 rather than on a thin film sheet. For example, the multi-point light source 106 may be passed under an inkjet printer and cells of the optical printer may be formed by the inkjet printer to provide a cell-specific prescription to smooth a measured light distribution.

Figure 2:
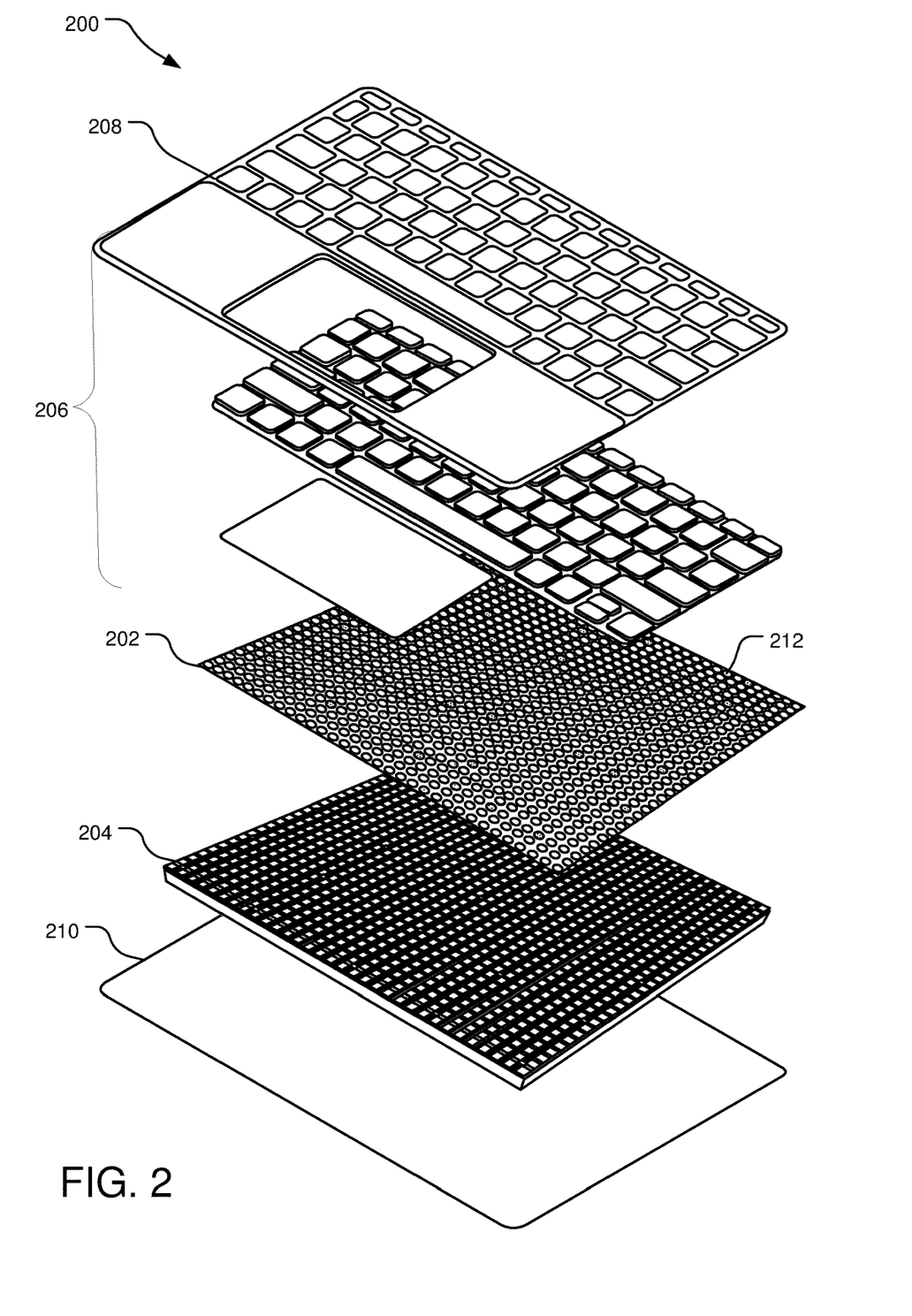
FIG. 2 illustrates an example electronic device including an optical filter for smoothing irregularities present in a light distribution generated by a back panel.

FIG. 2 illustrates an example electronic device 200 (e.g., a keyboard) including an optical filter 202 for smoothing irregularities present in a light distribution generated by a back panel 204. In one implementation, the back panel 204 is an LED array that provides backlighting for the keyboard 200. The electronic device 200 includes various upper layers 206 (e.g., keypad, circuitry, casing components) that are positioned to at least partially obstruct some light emitted by the back panel 204, while some of the light is emitted from an external surface 208 of the electronic device, (e.g., such as to illuminate edge portions of the keys). The electronic device 200 also includes a lower layer 210 (e.g., a backplane) below the back panel 204.

The optical filter 202 includes a number of filter cells (e.g., a cell 212) that are individually-tuned to include different filtering characteristics to smooth a resulting light distribution that is emitted by the back panel 204 and through the external surface 208. According to one implementation, each of the filter cells in the optical filter 202 is individually-tuned to reduce light throughput by a predetermined degree that is based on a measured luminance of one or more of the underlying LEDs of the back panel 204. Additionally, the filter cells may be individually-tuned to correct for inconsistent build characteristics in the upper layers 206 that contribute to irregularities in light emitted through the external surface 208. For example, an uneven paint distribution on one of the upper layers of a keyboard may result in both bright spots and dark spots in a same region whereas an even paint distribution may result of a uniform light distribution for that same region. Likewise, fabric, laser etched materials, and other features can also block light with a variable tolerance.

To generate the optical filter 202, brightness of the electronic device is initially determined. In one implementation, unfiltered light emitted from the back panel 204 is measured to identify inconsistencies in brightness that are attributable to variable tolerances of different light emitters (e.g., as described with respect to FIG. 1), and a uniform calibrated light source is directed through the upper layers 206 of the electronic device 200 to measure throughput affected by build characteristics of the electronic device. For example, a distribution of the calibrated light source through the upper layers 206 may be compared to an 'ideal' theoretical distribution of a version of the electronic device 200 with no defects or surface features that result in unintentional variation of the light throughput. With these measurements, an overall brightness distribution can be estimated and used to determine filtering characteristics of the optical filter 102. An estimated brightness distribution may, for example, include a brightness value in association with each of a number of discrete regions of the external surface 208, where each region further corresponds to one or more underlying light emitters of the back panel 204. Brightness values of the estimated brightness distribution account for combined effects of variable brightness light emitters as well as inconsistent build characteristics affecting throughput of the external surface 208.

Once an estimated brightness distribution for the electronic device 200 is determined (e.g., as in the example methodology explained above), a set of brightness adjustments for increasing light distribution uniformity is also determined. In one implementation, a specific zero or non-zero brightness adjustment is determined in association with each of a number of discrete regions of the external surface 208, such as regions that individually correspond to a single underlying light emitter or a small grouping of light emitters. The determined set of brightness adjustments collectively ensure that the resulting distribution of light emitted from the electronic device 200 complies with predefined luminosity criteria. For example, the predefined luminosity criteria may specify minimum and maximum brightness thresholds to further uniformity.

The optical filter 202 includes a number of cells that are each individually-tuned to apply one of the determined brightness adjustments to the associated region of the back panel such that light emitted from a corresponding region of the external surface 208 complies with the luminosity criteria. In one implementation, the optical filter includes a number of cells equaling the number of light emitters of the back panel 204 and each cell of the optical filter is sized and shaped to align with a corresponding light emitter of the back panel 204. For example, each cell is either unshaded (providing no adjustment) or shaded (providing a specifically-tuned adjustment based on brightness of the corresponding LED).

Figure 3:
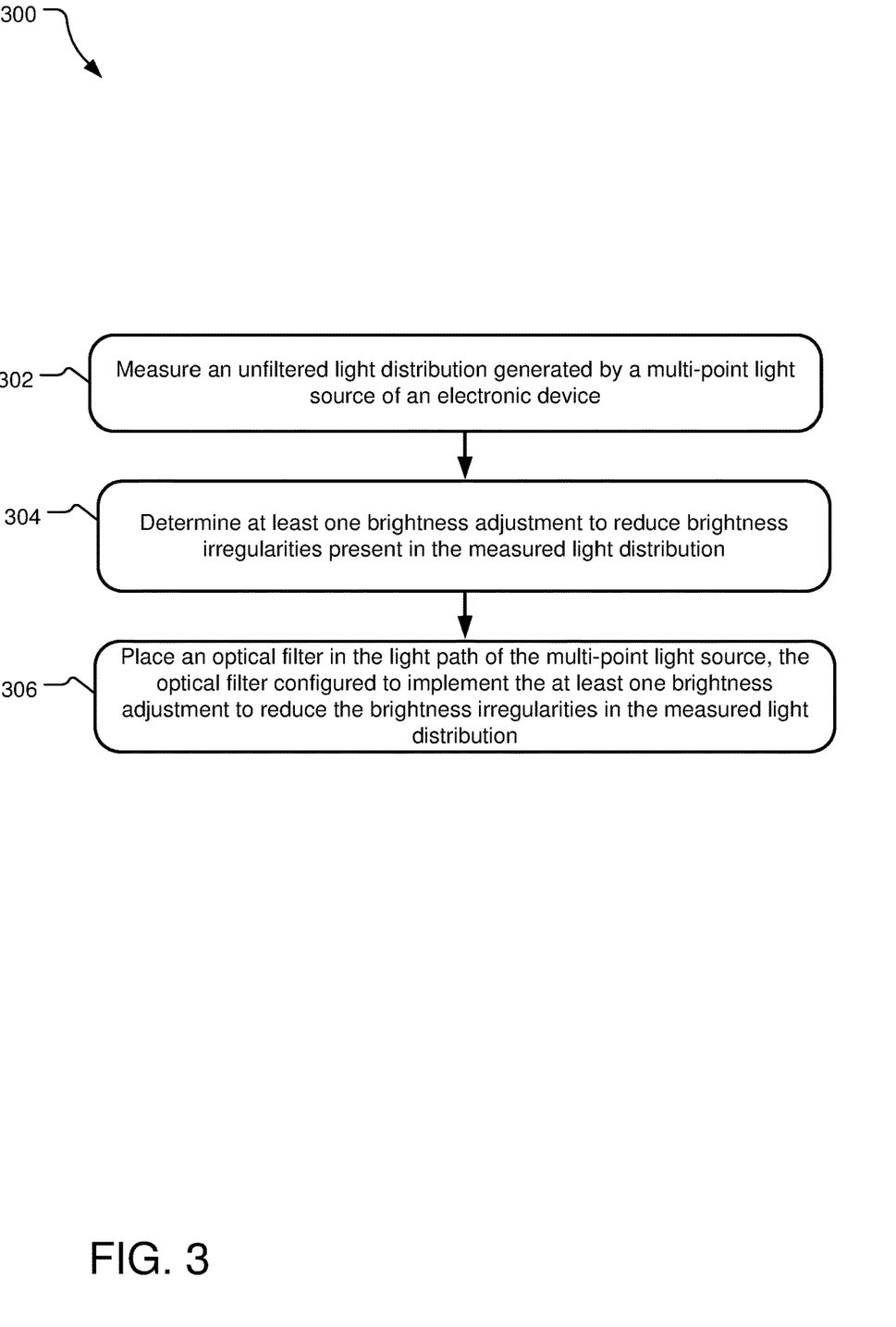
FIG. 3 illustrates example operations for smoothing irregularities present in an unfiltered light distribution generated by a multi-point light source.

FIG. 3 illustrates example operations for smoothing irregularities present in an unfiltered light distribution generated by a multi-point light source, such as an LED back panel for a display, keyboard, or other back-light device surface. A measuring operation 302 measures the unfiltered light distribution generated by the multi-point light source. In one implementation, the measurement operation 302 takes an image of the multi-point light source and generates a luminosity map that assigns a brightness value assigned each point in a plane representing the multi-point light source. For example, each brightness value corresponds to one LED of the multi-point light source.

A determination operation 304 determines at least one brightness adjustment to reduce brightness irregularities present in the measured light distribution. In one implementation, the determination operation 304 generates an adjustment map that assigns adjustment values to each point in a plane representing an LED array of the multi-point light source. Each non-zero adjustment in the adjustment map reflects a desired reduction of light throughput for a corresponding region of the multi-point light source (e.g., one or more specific light emitters).

Each adjustment determined by the determination operation 304 serves to increase uniformity of the resulting light distribution in accord with predefined luminosity criteria. Luminosity criteria may take on different characteristics in different implementations. In one implementation, luminosity criteria specify a maximum brightness and/or minimum brightness of an individual light emitter for the multi-point light source. In another implementation, luminosity criteria specify an average luminosity or luminosity range for individual adjacent groups of cells in the optical filter. For example, the luminosity criteria may specify that each 2×2 subarray within an LED back panel is to have an average luminosity between a defined low threshold and a defined high threshold. In other implementations, the luminosity criteria may specify other criteria to achieve smoothing.

A placement operation 306 places an optical filter in the light path of the multi-point light source. The optical filter includes a number of cells individually-tuned to implement the determined brightness adjustments. In one implementation, the optical filter includes number of cells equaling the number of light emitters of the multi-point light source, and each cell of the optical filter is sized and shaped to aligned with a corresponding one of the light emitters. For example, each cell is either unshaded (providing no adjustment) or shaded (providing a specifically-tuned adjustment based on brightness of the corresponding light emitter). Each shaded cell of the filter reduces light of a corresponding light emitter by a specifically elected magnitude such that the resulting filtered light assumes a brightness value that is between predefined minimum and maximum thresholds. As a result, the optical filter smooths the unfiltered light distribution.

Figure 4:
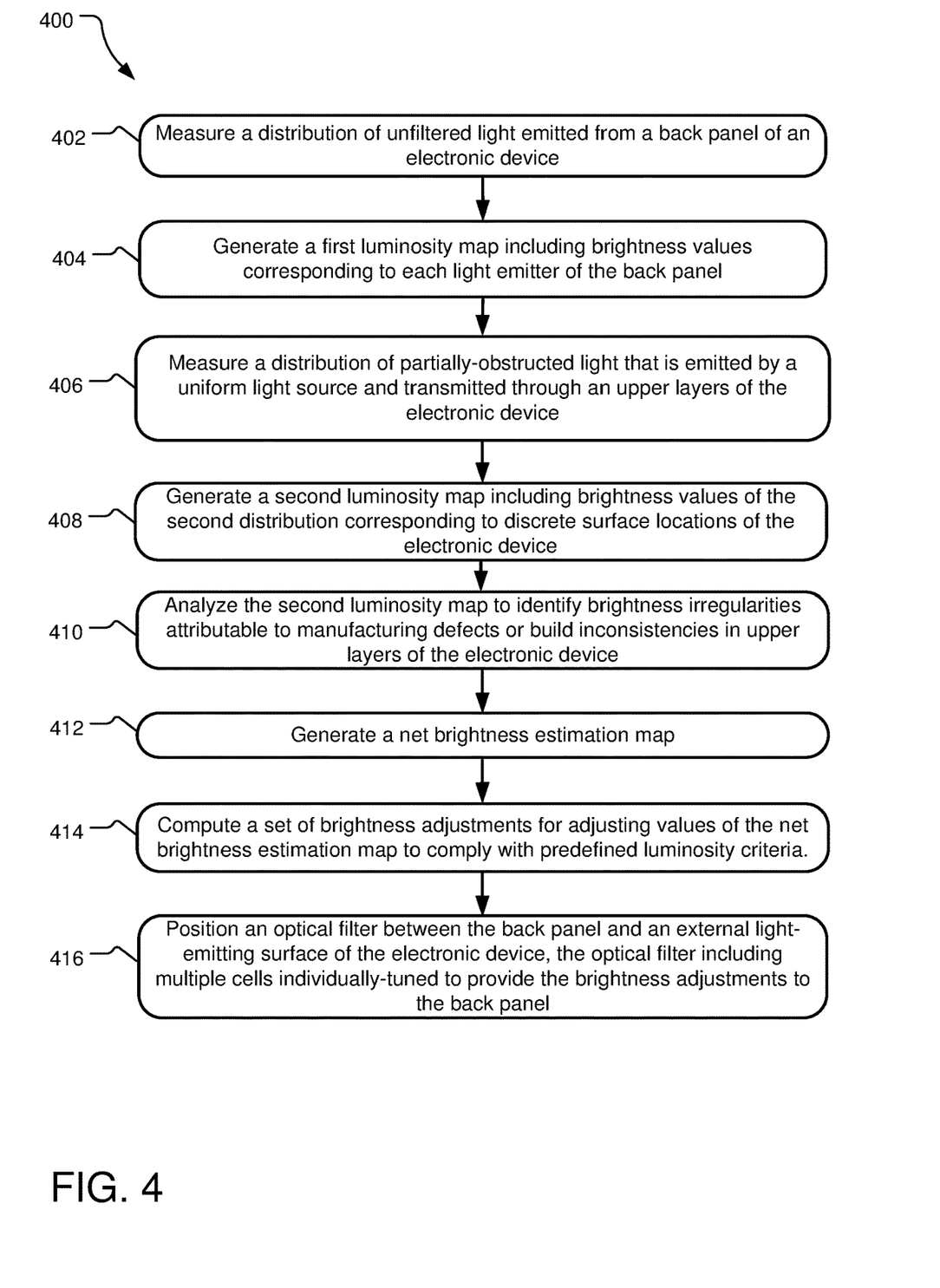
FIG. 4 illustrates example operations for increasing uniformity of a light distribution including irregularities caused by physical obstructions within a light path of an electronic device.

FIG. 4 illustrates example operations 400 for increasing uniformity of a light distribution to smooth irregularities caused by variable brightness light emitter components and inconsistent build characteristics of upper layers within an electronic device. The electronic device includes a back panel that emits light from multiple discrete point sources, such as an array of LEDs. The electronic device includes at least some internal components positioned to at least partially obstruct some light emitted by the back panel before the light is emitted from an external surface of the electronic device. For example, the electronic device may be a keyboard with keys positioned to obstruct some light while edges of the keys are illuminated by a portion of the light that is not obstructed.

A first measuring operation 402 measures a distribution of unfiltered (unobstructed) light emitted from the back panel to identify irregularities attributable to performance discrepancies from one light emitter to another. A first mapping operation 404 generates a first luminosity map including a brightness value corresponding to each light emitter of the back panel.

A second measuring operation 408 measures a distribution of partially-obstructed light that has been emitted by a uniform light source and transmitted through one or more upper layers of the electronic device. For example, a calibrated, uniform light source may be positioned to transmit light through upper layers of a keyboard (e.g., through gaps between keys, outer casing, trackpad) in order to identify regions that result in higher and/or lower light throughput than intended by design. These features (e.g., inconsistent build characteristics) include defects and manufacturing inconsistencies that lead to higher or lower light throughput in certain areas of the external device. For example, an uneven paint distribution on one of the upper layers of a keyboard may result in both bright spots and dark spots in a same region whereas an even paint distribution may result of a uniform light distribution for that same region. Likewise, fabric, laser etched materials, and other features can also block light with a variable tolerance.

A second mapping operation 408 generates a second luminosity map including brightness values measured by the second measuring operation 406. An analyzing operation 410 analyzes the second luminosity map to identify brightness irregularities (e.g., increases or decreases) that are attributable to inconsistent build characteristics of the electronic device, such as thin or thick paint spots. For example, the analyzing operation 410 may compare the second luminosity map (corresponding to light transmitted through the device upper layers) to an 'ideal' theoretical distribution produced by a perfect variation of the electronic device with no defects or surface features that result in unintentional variation of the light throughput.

A brightness estimating operation 412 generates a net brightness estimation map by combining the first and second luminosity maps such that the resulting maps estimates net output brightness of the electronic device in a manner that account for both the brightness variability of individual LED components and also for brightness increases and decreases due to inconsistent build characteristics.

A computation step 414 computes a set of brightness adjustments to adjust brightness of each point on the net brightness estimation map to ensure that all light emitted from the back panel and through the upper layers of the electronic device complies with predetermined luminosity criteria. In one implementation, the computed brightness adjustments are in the form of an array (e.g. of zero and non-zero filtering values), where each value in the array corresponds to a brightness adjustment for a single light emitter of the back panel to ensure that the array, as a whole, satisfies the predefined luminosity criteria.

A positioning operation 416 positions an optical filter light path of the multi-point light source. The optical filter includes a number of cells individually-tuned to implement the set of brightness adjustments computed by the computing operation 414. In one implementation, the optical filter includes a number of cells equaling the number of light emitters of the back panel and each cell of the optical filter is sized and shaped to align with a corresponding LED of the back panel. For example, each cell is either unshaded (providing no adjustment) or shaded (providing a specifically-tuned adjustment based on brightness of the corresponding light emitter).

The optical filter provides prescriptive filtering on a per-cell basis such that each shaded cell reduces light of a corresponding light emitter by a specifically-determined magnitude such that the resulting distribution of filtered light satisfies the luminosity criteria (e.g., specified minimum and maximum brightness thresholds, either for each emitter individually or all lights as a whole). As a result, a resulting light distribution of the device is smoothed to generally eliminate irregularities due to component-to-component variations in LED performance as well as to eliminate irregularities potentially induced by various obstructive layers between the back panel and the light-emitting surface of the electronic device.

Figure 5:
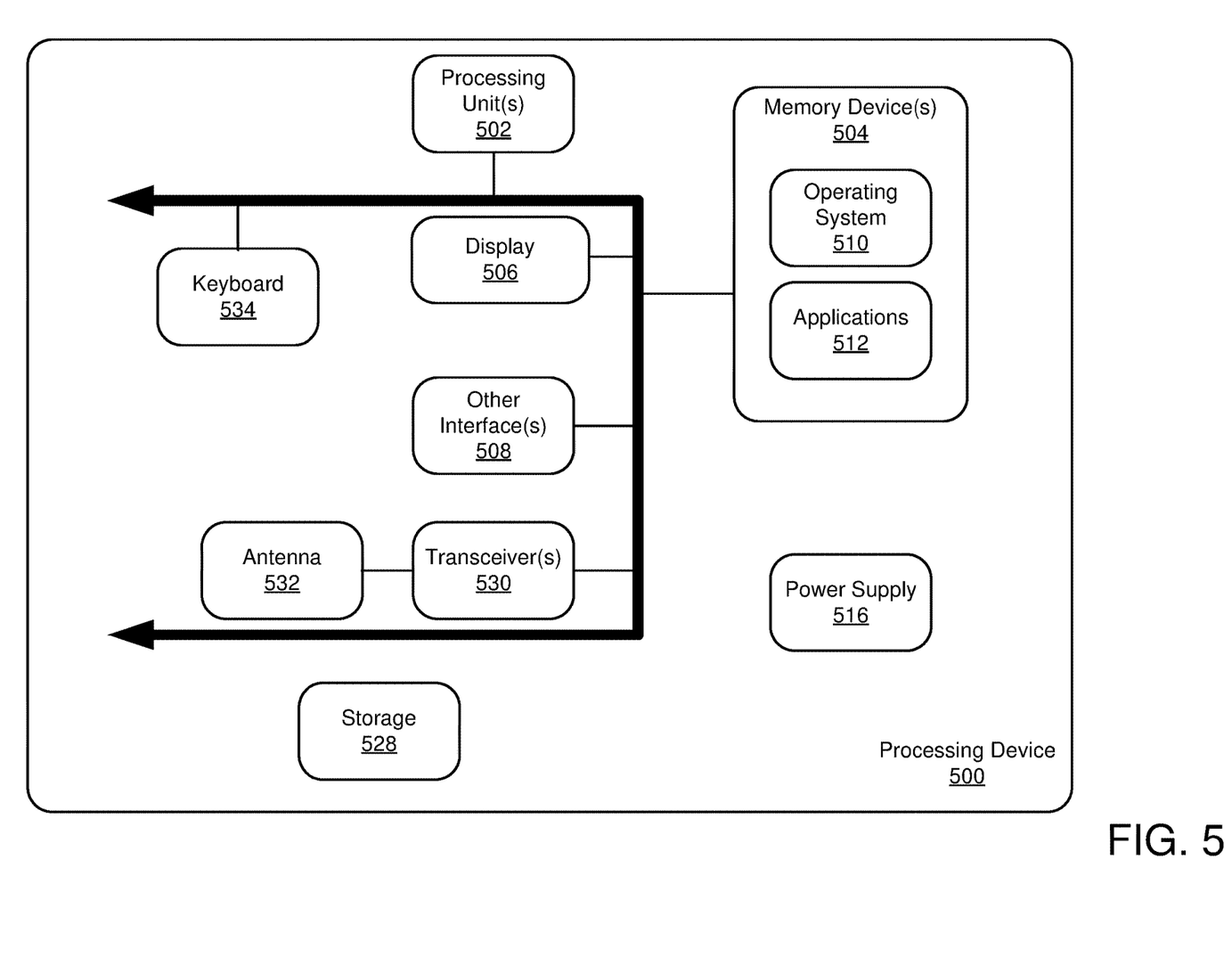
FIG. 5 illustrates an example of a processing device suitable for incorporating an optical filter for smoothing light source distribution.

FIG. 5 illustrates an example schematic of a processing device 500 with a back panel that may incorporate an optical filter according to the implementations described herein. The processing device 500 includes one or more processing unit(s) 502, one or more memory 504, a display 506, and other interfaces 508 (e.g., buttons). The memory 504 generally includes both volatile memory (e.g., RAM) and non-volatile memory (e.g., flash memory). An operating system 510, such as the Microsoft Windows® operating system, the Microsoft Windows® Phone operating system or a specific operating system designed for a gaming device, resides in the memory 504 and is executed by the processing unit(s) 502, although it should be understood that other operating systems may be employed.

One or more applications 512 are loaded in the memory 504 and executed on the operating system 510 by the processing unit(s) 502. The processing device 500 includes a power supply 516, which is powered by one or more batteries or other power sources and which provides power to other components of the processing device 500. The power supply 516 may also be connected to an external power source that overrides or recharges the built-in batteries or other power sources. The processing device 500 includes one or more communication transceivers 530 and an antenna 532 to provide network connectivity (e.g., a mobile phone network, Wi-Fi®, BlueTooth®). The processing device 500 may also include various other components, such as a keyboard 534, a positioning system (e.g., a global positioning satellite transceiver), one or more accelerometers, one or more cameras, an audio interface, and storage devices 528. Other configurations may also be employed.

In an example implementation, an optical filter is embedded within the display 506, such as between a back panel and a glass touch surface. In another implementation, an optical filter is included within the keyboard 534.

The processing device 500 may include a variety of tangible computer-readable storage media and intangible computer-readable communication signals. Tangible computer-readable storage can be embodied by any available media that can be accessed by the processing device 500 and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the processing device 500. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some embodiments may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one implementation, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

An example method disclosed herein includes measuring a light distribution generated by multiple light sources arranged within an electronic device and determining at least one brightness adjustment based on the measured light distribution that is sufficient to locally reduce light output within a discrete region of a surface of the electronic device to satisfy predefined luminosity criteria. The method further includes applying an optical filter between the multiple light sources and the surface, the optical filter configured to reduce light output within the discrete region according to the at least one brightness adjustment.

Another example method of any preceding method includes determining a plurality of brightness adjustments each corresponding to one of a plurality of discrete regions of the surface of the electronic device, the plurality of brightness adjustments sufficient to locally reduce light output to satisfy the predefined luminosity criteria within each of the plurality of discrete regions.

In another example method of any preceding method, the optical filter includes a plurality of individually-tuned cells configured increase uniformity of light emitting at the surface of the electronic device according to the determined plurality of brightness adjustments.

In still another example method of any preceding method, each one of the determined plurality of brightness adjustments is determined with respect to a single light-emitting diode (LED) of an LED array.

In another example method of any preceding method, the multiple light sources include multiple groups of adjacent light sources and the optical filter includes multiple groups of individually-tuned cells, each one of the multiple groups of individually-tuned cells configured to reduce an average light output for a corresponding one of the multiple groups of adjacent light sources to satisfy the predefined luminosity criteria.

In yet another example method of any preceding method, the optical filter includes a plurality of individually-tuned cells and the method further comprises printing the individually-tuned cells directly on components internal to the electronic device.

In yet another example method of any preceding method, the optical filter includes a plurality of individually-tuned cells and the method further includes printing the individually-tuned cells on a thin film sheet positioned between the multiple light sources and the surface.

In another example method of any preceding method, the optical filter includes a plurality of individually-tuned cells providing different non-zero brightness reductions.

According to one implementation, an electronic device disclosed herein includes
multiple light sources collectively providing a light distribution at a surface of the electronic device and an optical filter positioned between the multiple light sources and the surface. The optical filter includes a plurality of individually-tuned cells each configured to reduce brightness within a corresponding area of the surface of the electronic device to satisfy predefined luminosity criteria such that the individually-tuned cells collectively increase brightness uniformity of the light distribution at the surface.

In an example electronic device of any preceding electronic device, the multiple light sources include multiple groups of adjacent light sources and the individually-tuned cells are configured to reduce an average light output for each group of the adjacent light sources to satisfy the predefined luminosity criteria.

In yet another example electronic device of any preceding electronic device, the individually-tuned cells are printed directly on components internal to the electronic device.

In yet another example electronic device of any preceding electronic device, the individually-tuned cells are printed on a thin film sheet positioned between the multiple light sources and the surface.

In still another example electronic device of any preceding electronic device, the multiple lights sources include an array of LEDs providing backlighting for a display.

In another example electronic device of any preceding electronic device, the multiple light sources include an array of LEDs providing backlighting for a keyboard.

An example method disclosed herein includes determining a plurality of brightness adjustments sufficient to alter a distribution of light at the device surface to satisfy predefined luminosity criteria. Each of the brightness adjustments corresponds to a discrete region of a device surface illuminated by multiple light sources, and the plurality of brightness adjustments are sufficient to alter a distribution of light at the device surface to satisfy predefined luminosity criteria. The method further includes applying an optical filter between the device surface and the multiple light sources. The optical filter includes a plurality of individually-tuned cells configured to reduce light output at the device surface according to the determined plurality of brightness adjustments.

In another example method of any preceding method, the multiple light sources are arranged in a lower portion of an electronic device and the method further comprises measuring a first distribution of the light transmitted to a surface of the lower portion by the multiple light sources; measuring a second distribution of light transmitted through an upper portion of the electronic device; determining the plurality of brightness adjustments based on a summation of the first distribution and the second distribution; and applying the optical filter between the upper portion and the lower portion.

In still another example method of any preceding method, the optical filter increases a uniformity of the distribution of light at the device surface.

In still another example method of any preceding method, the multiple light sources include multiple groups of adjacent LEDs and the optical filter includes multiple groups of individually-tuned cells. Each one of the multiple groups of individually-tuned cells is configured to reduce an average light output for a corresponding one of the multiple groups of adjacent LEDs to satisfy the predefined luminosity criteria.

In yet another example method of any preceding method, the optical filter includes a plurality of individually-tuned cells and the method further comprises printing the individually-tuned cells directly on components internal to the electronic device.

In another example method of any preceding method the optical filter includes a plurality of individually-tuned cells and the method further comprises printing the individually-tuned cells on a thin film sheet positioned between the multiple light sources and the surface.

An example system disclosed herein includes a means for determining a plurality of brightness adjustments sufficient to alter a distribution of light at the device surface to satisfy predefined luminosity criteria, where each of the brightness adjustments corresponds to a discrete region of a device surface illuminated by multiple light sources and the plurality of brightness adjustments are sufficient to alter a distribution of light at the device surface to satisfy predefined luminosity criteria. The system further includes a means for applying an optical filter between the device surface and the multiple light source, where the optical filter includes a plurality of individually-tuned cells configured to reduce light output at the device surface according to the determined plurality of brightness adjustments.

Another example method disclosed herein includes a means for measuring a light distribution generated by multiple light sources arranged within an electronic device and a means for determining at least one brightness adjustment based on the measured light distribution that is sufficient to locally reduce light output within a discrete region of a surface of the electronic device to satisfy predefined luminosity criteria. The method further includes a means for applying an optical filter between the multiple light sources and the surface, wherein the optical filter is configured to reduce light output within the discrete region according to the at least one brightness adjustment.

The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A method comprising:
    measuring a light distribution generated by multiple light sources arranged within an electronic device;
    determining a plurality of brightness adjustments based on the measured light distribution, each of the brightness adjustments corresponding to one of a plurality of discrete regions of the surface of the electronic device, the plurality of brightness adjustments each being sufficient to locally reduce light output and satisfy predefined luminosity criteria within a corresponding one of the discrete regions of the surface of the electronic device; and
    applying an optical filter between the multiple light sources and the surface, the optical filter including shaded cells that are each configured to reduce light output within the discrete region according to a select brightness adjustment of the determined plurality of brightness adjustments.

2. The method of claim 1, wherein the optical filter includes a plurality of individually-tuned cells configured increase uniformity of light emitting at the surface of the electronic device according to the determined plurality of brightness adjustments.

3. The method of claim 2, wherein each one of the determined plurality of brightness adjustments is determined with respect to a single light-emitting diode (LED) of an LED array.

4. The method of claim 1, wherein the multiple light sources include multiple groups of adjacent light sources and the optical filter includes multiple groups of individually-tuned cells, each one of the multiple groups of individually-tuned cells configured to reduce an average light output for a corresponding one of the multiple groups of adjacent light sources to satisfy the predefined luminosity criteria.

5. The method of claim 1, wherein the optical filter includes a plurality of individually-tuned cells and the method further comprises printing the individually-tuned cells directly on components internal to the electronic device.

6. The method of claim 1, wherein the optical filter includes a plurality of individually-tuned cells and the method further comprises printing the individually-tuned cells on a thin film sheet positioned between the multiple light sources and the surface.

7. The method of claim 1, wherein the optical filter includes a plurality of individually-tuned cells providing different non-zero brightness reductions.

8. An electronic device including:
    multiple light sources collectively providing a light distribution at a surface of the electronic device; and
    an optical filter positioned between the multiple light sources and the surface, the optical filter including a thin film sheet having a plurality of individually-tuned cells each configured to locally reduce brightness within a corresponding area of the surface of the electronic device to satisfy predefined luminosity criteria within a corresponding one of a plurality of discrete regions of the surface of the electronic device, wherein the multiple light sources include multiple groups of adjacent light sources and the individually-tuned cells are configured to reduce an average light output for each group of the adjacent light sources to satisfy the predefined luminosity criteria.

9. The electronic device of claim 8, wherein the individually-tuned cells are printed directly on components internal to the electronic device.

10. The electronic device of claim 8, wherein the individually-tuned cells are printed on the thin film sheet, and the thin film sheet is positioned between the multiple light sources and the surface.

11. The electronic device of claim 8, wherein the multiple lights sources include an array of LEDs.

12. The electronic device of claim 8, wherein the individually-tuned cells of the optical filter collectively increase brightness uniformity of the light distribution at the surface.

13. A method comprising:
    determining a plurality of brightness adjustments corresponding to a plurality of discrete regions of a device surface illuminated by multiple light sources, the plurality of brightness adjustments sufficient to alter a distribution of light at the device surface to satisfy predefined luminosity criteria;
    applying an optical filter between the device surface and the multiple light sources, the optical filter including a plurality of individually-tuned cells that are each shaded to reduce light output at the device surface according to a select brightness adjustment of the determined plurality of brightness adjustments.

14. The method of claim 13, wherein the multiple light sources are arranged in a lower portion of an electronic device and the method further comprises:
    measuring a first distribution of the light transmitted to a surface of the lower portion by the multiple light sources;
    measuring a second distribution of light transmitted through an upper portion of the electronic device;
    determining the plurality of brightness adjustments based on a summation of the first distribution and the second distribution;
    applying the optical filter between the upper portion and the lower portion.

15. The method of claim 13, wherein the optical filter increases a uniformity of the distribution of light at the device surface.

16. The method of claim 13, wherein the multiple light sources include multiple groups of adjacent LEDs and the optical filter includes multiple groups of individually-tuned cells, each one of the multiple groups of individually-tuned cells configured to reduce an average light output for a corresponding one of the multiple groups of adjacent LEDs to satisfy the predefined luminosity criteria.

17. The method of claim 13, wherein the optical filter includes a plurality of individually-tuned cells and the method further comprises printing the individually-tuned cells directly on components internal to the electronic device.

18. The method of claim 13, wherein the optical filter includes a plurality of individually-tuned cells and the method further comprises printing the individually-tuned cells on a thin film sheet positioned between the multiple light sources and the surface.

* * * * *